(12) United States Patent
Kuisma

(10) Patent No.: US 11,920,931 B2
(45) Date of Patent: Mar. 5, 2024

(54) GYROSCOPE WITH SELF-TEST

(71) Applicant: MURATA MANUFACTURING CO., LTD., Nagaokakyo (JP)

(72) Inventor: Heikki Kuisma, Helsinki (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 519 days.

(21) Appl. No.: 17/307,569

(22) Filed: May 4, 2021

(65) Prior Publication Data
US 2021/0364292 A1 Nov. 25, 2021

(30) Foreign Application Priority Data
May 22, 2020 (FI) .................................... 20205519

(51) Int. Cl.
| | |
|---|---|
| G01D 1/16 | (2006.01) |
| G01C 19/5712 | (2012.01) |
| G01C 19/5762 | (2012.01) |
| G01D 1/18 | (2006.01) |
| G01D 3/08 | (2006.01) |
| G01D 5/24 | (2006.01) |
| G01H 11/06 | (2006.01) |
| G01H 13/00 | (2006.01) |
| G01R 31/26 | (2020.01) |
| G01R 31/28 | (2006.01) |
| G01R 31/3187 | (2006.01) |

(Continued)

(52) U.S. Cl.
CPC ..... *G01C 19/5712* (2013.01); *G01C 19/5762* (2013.01); *G01D 1/16* (2013.01); *G01D 1/18* (2013.01); *G01D 3/08* (2013.01); *G01D 5/24* (2013.01); *G01H 11/06* (2013.01); *G01H 13/00* (2013.01); *G01R 31/2644* (2013.01); *G01R 31/282* (2013.01); *G01R 31/2829* (2013.01); *G01R 31/2856* (2013.01); *G01R 31/3187* (2013.01); *H04B 2001/0491* (2013.01); *H04B 14/002* (2013.01)

(58) Field of Classification Search
CPC ............ G01C 19/5712; G01C 19/5762; G01C 19/5776; G01D 1/16; G01D 1/18; G01D 3/08; G01D 5/24; G01H 11/06; G01H 13/00; G01R 31/2644; G01R 31/282; G01R 31/2829; G01R 31/2856; G01R 31/3187; H04B 14/002; H04B 2001/0491
See application file for complete search history.

(56) References Cited

U.S. PATENT DOCUMENTS

| | | |
|---|---|---|
| 2010/0263445 A1 | 10/2010 | Hayner et al. |
| 2011/0146402 A1 | 6/2011 | Donadel et al. |

(Continued)

OTHER PUBLICATIONS

Finnish Search Report dated Jan. 20, 2021 corresponding to Finnish Patent Application No. 20205519.

(Continued)

*Primary Examiner* — Catherine T. Rastovski
*Assistant Examiner* — Yossef Korang-Beheshti
(74) *Attorney, Agent, or Firm* — SQUIRE PATTON BOGGS (US) LLP

(57) ABSTRACT

A microelectromechanical gyroscope which comprises one or more Coriolis masses driven by a drive transducer and a force-feedback system. The force-feedback circuit comprises first and second sideband modulators and the self-test circuit comprises first and second sideband demodulators.

5 Claims, 14 Drawing Sheets

(51) Int. Cl.
*H04B 1/04* (2006.01)
*H04B 14/00* (2006.01)

(56) References Cited

U.S. PATENT DOCUMENTS

| | | |
|---|---|---|
| 2011/0192226 A1 | 8/2011 | Hayner et al. |
| 2014/0000366 A1* | 1/2014 | Blomqvist ......... G01C 19/5776 |
| | | 73/504.12 |
| 2014/0250970 A1 | 9/2014 | Fang et al. |
| 2015/0377625 A1* | 12/2015 | Aaltonen ........... G01C 19/5776 |
| | | 73/504.12 |
| 2018/0058854 A1* | 3/2018 | Suzuki ............... G01C 19/5726 |
| 2021/0325425 A1* | 10/2021 | Nagata ................ G01P 15/0802 |

OTHER PUBLICATIONS

European Search Report dated Sep. 7, 2021 corresponding to European Patent Application No. 21168828.

* cited by examiner

GYROSCOPE WITH SELF-TEST

FIELD OF THE DISCLOSURE

This disclosure relates to gyroscopes with mobile proof masses, and more particularly to gyroscopes where force-feedback is implemented. The present disclosure further concerns self-tests in such gyroscopes.

BACKGROUND OF THE DISCLOSURE

Microelectromechanical (MEMS) gyroscopes can comprise one or more Coriolis masses that are driven into a primary oscillation mode (which may also be called the drive oscillation mode) by one or more drive transducers which are coupled to the Coriolis masses either directly or indirectly. Coriolis masses should preferable also be easily actuated into a secondary oscillation mode (which may also be called the sense oscillation mode) by the Coriolis force when the gyroscope undergoes angular rotation. One or more sense transducers are coupled to at least one Coriolis mass for measuring the secondary oscillation. The amplitude of the secondary oscillation is then a measure of the angular rotation rate, and the corresponding measurement signal produced by the sense transducers may be called a sense signal.

Coriolis masses are typically suspended from an adjacent fixed structure by flexible suspenders, which may also be called springs or suspension springs. The point where a spring is attached to a fixed structure may be called an anchor point. Suspenders are dimensioned to allow the primary oscillation mode and the secondary oscillation mode of the Coriolis masses to occur. In other words, the suspenders give the mass mobility in the desired oscillation directions.

It is sometimes beneficial to implement a force-feedback system which uses the amplitude and phase information contained in the sense signal to send a corresponding force-generating voltage to one or more force-feedback transducers which are also coupled to the Coriolis masses. With a suitably arranged force-feedback system, the force-feedback transducers may be configured to generate a counter-force which is closely synchronized with the secondary oscillation. The amplitude of the secondary oscillation in the Coriolis masses can then be reduced almost to zero even as the Coriolis force acts on the Coriolis masses. The amplitude of the in-phase (same phase as the Coriolis force) component of the force-generating voltage required to keep the Coriolis mass stationary (or almost stationary) at each moment will then be proportional to the momentary angular rotation rate.

The Coriolis masses are typically set to oscillate in resonance in its primary oscillation mode in order to achieve a large amplitude with a relatively small actuating force. For a maximal signal-to-noise ratio, the Coriolis masses should be operated in resonance also in their secondary oscillation mode. It is also vital for the accuracy of the gyroscope that the secondary resonant frequency, at which the Coriolis masses resonate in the secondary oscillation mode, is substantially equal to the primary oscillation frequency which sets the Coriolis masses into resonance oscillation in their primary oscillation mode.

In conventional gyroscopes without force-feedback, the phase of the secondary oscillation of the Coriolis masses changes very rapidly as a function of frequency close to the resonance frequency. Great instability in the phase shift and in the detected in-phase signal can result from matching the two resonant frequencies if even a very slight frequency shift occurs in the primary or the secondary resonance of the Coriolis mass.

Force-feedback can help to maintain resonance in the secondary oscillation mode because it dampens the secondary resonance and gives the frequency response a sufficiently wide bandwidth. In a force-feedback system the phase therefore changes much more slowly as a function of frequency and very little instability will occur due to slight frequency variations. The primary oscillation and secondary resonant frequencies can then be more easily matched (or nearly matched). This produces a greatly enhanced signal-to-noise ratio compared to conventional gyroscopes where the primary and secondary resonant frequencies are set apart from each other.

Self-tests are required in automotive gyroscopes for guaranteeing proper operation of the primary and secondary resonators and circuits connected to them. Operation of a MEMS gyroscope may deteriorate or even cease completely if contacts between the micro-electro-mechanical part and the circuit fail due to accumulated external stress. Self-tests should detect this kind of contact failures as well as any other faults or drifts that may occur that will risk proper operation of the gyroscope. A self-test for the primary resonator and circuit can be easily achieved by just comparing signal levels at circuit nodes with set criteria. A self-test for the secondary resonator and circuits connected to it is not as trivial since the signals at circuit nodes are zero when the gyroscope is in rest and are present only under rotation. Applying mechanical rotation would enable testing the secondary system, but it is extremely difficult to create the rotation stimulus by electrical means within the gyroscope itself. Electrical signals that are fed through the signal path can also be used if they are transmitted via the MEMS part also.

Pilot tones, i.e. sinusoidal signals that are located well outside the signal bandwidth of the gyroscope, have been used in force feed-back gyroscopes for self-testing the operation of the secondary system. Damping by force feed-back widens the bandwidth of the secondary resonator greatly, typically from a few Hertz to up to few kilo Hertz. Due to this wide bandwidth, pilot tones can be introduced without affecting the signals within the required signal bandwidth, typically up to few hundred Hertz, which is present in normal gyro operation. Pilot tones are fed to the feed-back circuit at selected frequencies and amplitudes. They will be transmitted to the MEMS-part via a force-feedback transducer and they will generate motion of the Coriolis mass, which motion is then detected by the secondary transducers. If the pilot tones are found in the output of the gyroscope at corresponding frequencies and amplitudes, then the gyroscope can be deemed to operate as required and the self-test is passed.

The problem with the self-test based on pilot tones is that it may be affected e.g. by external vibrations that may introduce signals to the gyroscope output at or near the pilot tone frequencies. To overcome this issue several pilot tones have been used at the same time with a requirement that at least some of them must fulfil the criterion. This kind of self-test may be complex and unreliable due to multiple test signals and logic needed for excluding the affected pilot tones.

BRIEF DESCRIPTION OF THE DISCLOSURE

An object of the present disclosure is to provide an apparatus for reliably indicating proper operation of a gyroscope, particularly in the presence of vibrations or other external disturbances. Another object of the present disclosure is to provide a simple apparatus for self-testing with only one self-test signal that can reliably be compared with only one signal level criterion.

The object of the disclosure is achieved by what is stated in the independent claims. The preferred embodiments of the disclosure are disclosed in the dependent claims.

The disclosure is based on the idea of adding to the force feedback signal a sideband signal doubly modulated from a primary oscillation signal, demodulating this sideband signal after it has propagated through the secondary resonator and performing a self-test based on a comparison between this demodulated signal and the primary oscillation signal.

BRIEF DESCRIPTION OF THE DRAWINGS

In the following the disclosure will be described in greater detail by means of preferred embodiments with reference to the accompanying drawings, in which.

DETAILED DESCRIPTION OF THE DISCLOSURE

Figure 1A:
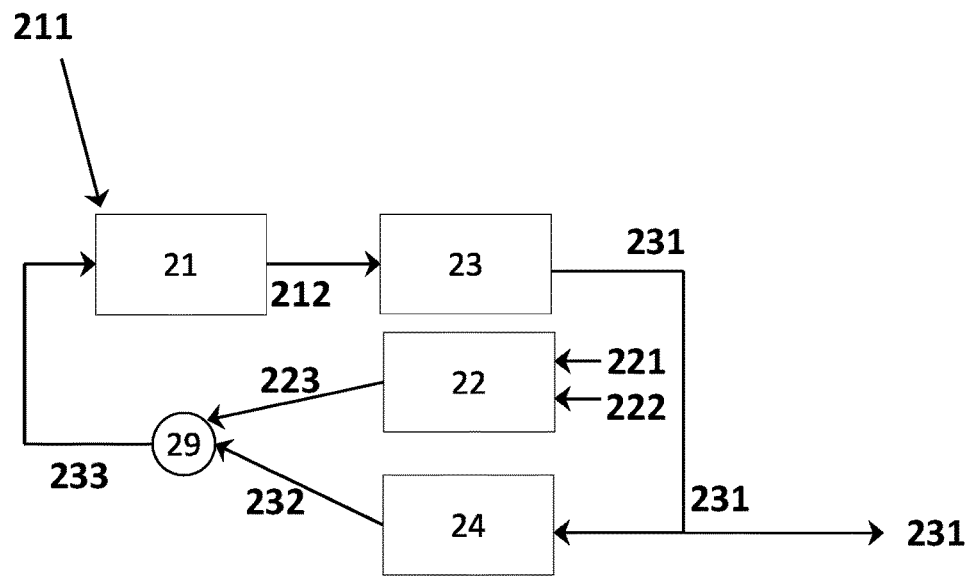
FIG. 1a illustrates circuit components and signals in a MEMS gyroscope.

This disclosure describes a microelectromechanical gyroscope which comprises one or more Coriolis masses which are coupled to a drive transducer which actuates the one or more Coriolis masses into primary oscillation movement at a primary oscillation frequency $F_{prim}$. The one or more Coriolis masses are configured to be actuated into secondary oscillation movement by the Coriolis force when the gyroscope undergoes angular rotation, and the secondary oscillation mode has a secondary resonant frequency $F_{sec}$.

The gyroscope also comprises a drive sensing circuit comprising a drive sensing transducer which is coupled to measure the primary oscillation movement of the one or more Coriolis masses and configured to generate a drive tracking signal which tracks the primary oscillation movement of the one or more Coriolis masses.

The gyroscope also comprises a readout circuit comprising a sense transducer which is coupled to measure the secondary oscillation movement of the one or more Coriolis masses and configured to generate a sense signal which tracks the secondary oscillation movement of the one or more Coriolis masses.

The gyroscope also comprises a force-feedback system comprising a force-feedback transducer coupled to the one or more Coriolis masses and a force feedback circuit coupled to the force-feedback transducer. The force-feedback circuit comprises a first sideband modulator which is configured to receive the drive tracking signal as input, to modulate the drive tracking signal with a first modulation frequency and to output a first sideband signal.

The force-feedback circuit further comprises a second sideband modulator which is configured to receive the first sideband signal as input, to modulate the first sideband signal with a second modulation frequency and to output a second sideband signal. The force-feedback circuit further comprises a summing element which is configured to receive the sense signal and the second sideband signal as input, to sum them together to generate a force-feedback signal and to output the force-feedback signal to the force-feedback transducer.

The gyroscope further comprises a self-test circuit coupled to the readout circuit. The self-test circuit comprises a multiplier which is configured to receive the sense signal and the drive tracking signal as input, multiply them with each other and output a self-test signal to a low-pass filter. The low-pass filter is configured to output a low-pass filtered self-test signal to a control unit.

The self-test circuit further comprises a first sideband demodulator and a second sideband demodulator, and either the sense signal or the drive tracking signal is demodulated in the first sideband demodulator at the first modulation frequency before entering the multiplier, and either the sense signal or the drive tracking signal is demodulated in the second sideband demodulator at the second modulation frequency before entering the multiplier.

The control unit is configured to compare the amplitude of the low-pass filtered self-test signal to a predetermined lower threshold value and to a predetermined upper threshold value and to generate a self-test failure indicator if the low-pass filtered self-test signal is below the lower threshold value or above the upper threshold value.

The sense signal may be filtered before it is fed back to the force-feedback loop. The filter may adjust the phase shift of the feed-back loop so that the force feed-back will be stable and filter out unwanted frequencies and prevent instability at higher resonant modes. The filter may be a phase shifter, a differentiator, an integrator, a low-pass, high-pass, band-pass or all-pass filter or a combination thereof. The sense signal may be passed through an amplifier before it reaches the filter, or the filter function may be incorporated in the amplifier.

The first sideband signal may comprise at least a first signal component at a first sideband frequency $F_{prim}-F_{mod1}$ and a second signal component at a second sideband frequency $F_{prim}+F_{mod1}$. The second sideband signal may comprise components at least at a first sideband frequency $F_{prim}-F_{mod1}-F_{mod2}$, a second sideband frequency $F_{prim}+F_{mod1}-F_{mod2}$, a third sideband frequency $F_{prim}-F_{mod1}+F_{mod2}$ and a fourth sideband frequency $F_{prim}+F_{mod1}+F_{mod2}$.

In this disclosure, the oscillation of the Coriolis masses may be referred to as oscillation which occurs in the mechanical domain. Circuits, such as the readout circuit, the force-feedback circuit and the frequency-feedback circuit, comprise an analogue domain with electronic elements such as resistors, capacitors and inductors, as well as amplifiers and filters which have been formed by combining such electronic elements. These circuits may also comprise digital elements which operate on signals in the digital domain. Each interface between the analogue and mechanical domains may comprise a force/voltage transducer, and each interface between the analogue and digital domains may comprise an A/D or D/A converter. In this disclosure, the term "transducer" refers to a device which either converts an input variable, such as a voltage, to a force which acts on the Coriolis mass, or produces an output variable, such as a voltage, based on the displacement of the Coriolis mass. The former function is mostly performed by drive transducers and force-feedback transducers, and the latter by sense transducers and drive-sensing transducers, but all transducers may be applicable for both force production and displacement measurement if necessary. A single transducer can be used for many functions if multiplexed in the time domain to a circuitry with a high enough frequency.

The transducers may for example be capacitive transducers which comprise a set of capacitor electrodes on a fixed structure paired with a set of adjacent capacitor electrodes on the Coriolis mass and electric connections which facilitate voltage input and output to these electrodes. Alternatively, the transducers may be piezoelectric transducers which comprise a piezoelectric element placed on the suspenders which support the Coriolis mass and electric connections which facilitate voltage input and output to these elements.

The drive sensing transducer measures the primary oscillation movement of the Coriolis mass. The drive tracking signal obtains a frequency which is equal the primary oscillation frequency $F_{prim}$. Depending on the resonance properties of the primary oscillation mode, this primary oscillation frequency may be equal to the primary resonant frequency, or it may deviate to some extent from the primary resonant frequency.

Force-Feedback and Modulation Principles

The general principles of force-feedback and modulation will be explained next, with reference to FIG. 1a. This figure illustrates a microelectromechanical gyroscope with a Coriolis mass (or several Coriolis masses) 21. This Coriolis mass has been driven by a drive signal applied to the drive transducer (not illustrated) to oscillate in a primary oscillation mode at a drive oscillation frequency $F_{prim}$. When the gyroscope experiences angular rotation, the Coriolis force imparts a mechanical input signal 211 to the Coriolis mass which maintains the secondary oscillation mode of the Coriolis mass as long as the gyroscope rotates. The gyroscope is designed to detect the amplitude of the mechanical input signal 211. The frequency of the mechanical input signal 211 is always equal to the primary oscillation frequency $F_{prim}$.

The secondary oscillation of the Coriolis mass converts the mechanical input signal 211 into a sense signal 212 which can be measured by sensing the movement of the Coriolis mass with a sense transducer. The amplitude and phase of the sense signal 212 will be influenced by the properties of the secondary resonator with resonant frequency $F_{sec}$. The readout circuit of the gyroscope may comprise an amplifier and a filter 23 which at least conditions the signal to high amplitude level and provides a proper phase for the closed feed-back loop. It may also filter out unwanted frequency components and improve the stability of the feed-back loop.

The force-feedback system comprises a force-feedback transducer at the interface between the analogue and mechanical domains. The force-feedback system also comprises a force-feedback circuit which receives the sense signal 231 as input. The force-feedback circuit may comprise a gain block 24 which amplifies the sense signal 231 and feeds the amplified sense signal 232 to summing element 29. The summing element outputs a force-feedback signal 233 back to the Coriolis mass 21 to damp the secondary resonance occurring at the secondary resonant frequency $F_{sec}$. The gain block may alternatively be placed within the readout-circuit so that the frequency-feedback circuit also receives the amplified sense signal 232 as input, and so that the output signal 231 at the bottom of the FIG. 1a, also is an amplified sense signal.

In a stabilized force-feedback loop, where the amplitude of the secondary oscillation has been reduced to zero or almost zero, the sense signal 231 determines the force required to keep the Coriolis mass stationary and this signal can be read as the gyroscope output. The force feedback circuit in FIG. 1a also comprises a sideband modulator 22. The sideband modulator receives as input the drive tracking signal 221 (with frequency $F_{prim}$) and a modulation signal 222. The frequency of the modulation signal is $F_{mod}$. The sideband modulator produces a two-sideband signal 223. FIG. 1b illustrates the drive tracking signal 221 and the two-sideband signal 223. The two-sideband signal comprises two components, one which has been shifted from $F_{prim}$ in the negative direction by the modulation $F_{mod}$ obtained from the modulation signal, and another component which has been shifted from $F_{prim}$ in the positive direction by the same amount. The two-sideband signal 223 has no component at the primary oscillation frequency $F_{prim}$.

The sidebands illustrated at the bottom of FIG. 1b can for example be obtained in the sideband modulator 22 by multiplying the sinusoidal drive tracking signal $221 = \sin(\omega_{prim} t)$ by a sinusoidal modulation signal $222 = \sin(\omega_{mod} t)$:

$$223 = \sin(\omega_{mod} t) \cdot \sin(\omega_{prim} t) = 0.5 \cdot [\cos(\omega_{prim} + \omega_{mod}) t - \cos(\omega_{prim} - \omega_{moa}) t], \quad (1)$$

where $\omega_{mod} = 2\pi F_{mod}$ and $\omega_{prim} = 2\pi F_{prim}$. The waveform of such a sinus-modulated sideband signal 223 with two sidebands is illustrated in FIG. 1c.

Figure 1B:
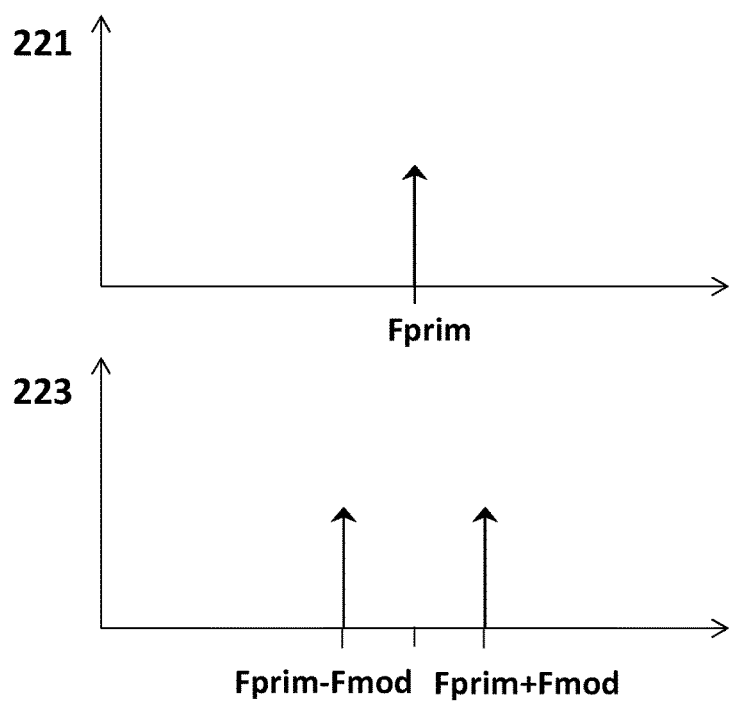
FIG. 1b illustrates signal components in a modulated sideband signal.
Figure 1C:
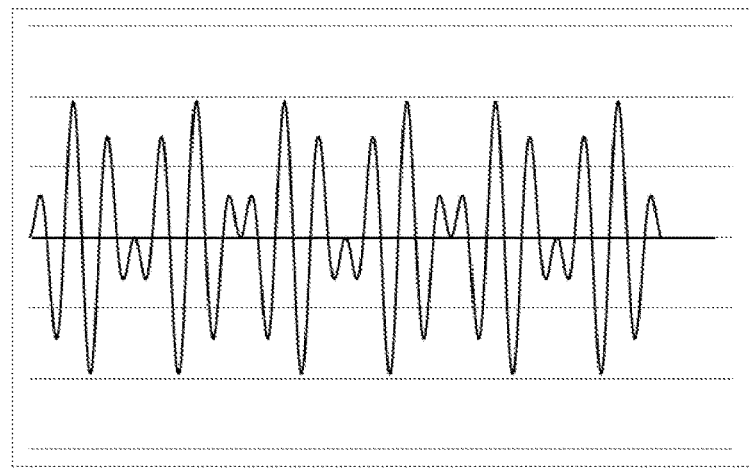
FIG. 1c illustrates the waveform of a sinus-modulated sideband signal.
Figure 1D:
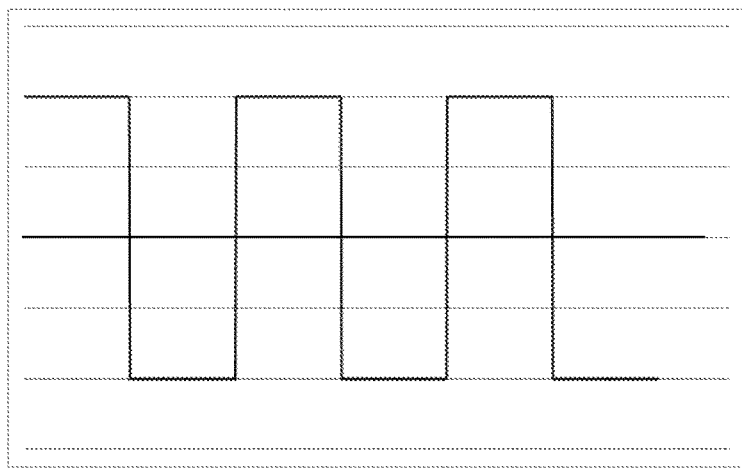
FIG. 1d illustrates a square-wave modulation signal.
Figure 1E:
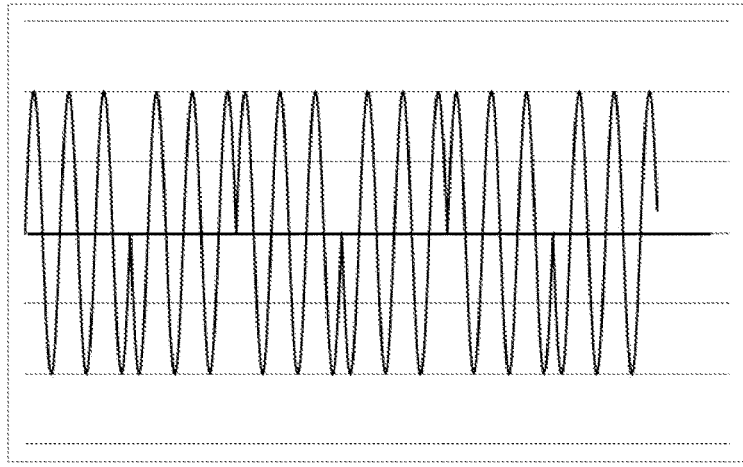
FIG. 1e illustrates the waveform of a square-wave modulated sideband signal.
Figure 1F:
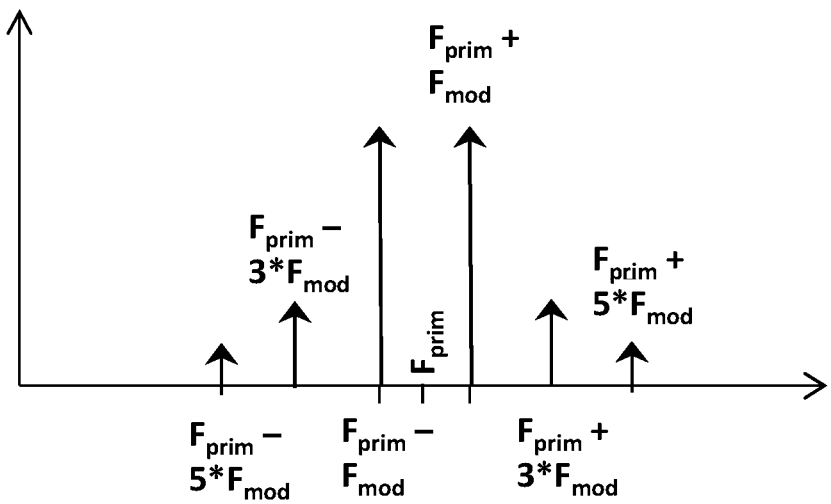
FIG. 1f illustrates signal components in a square-wave modulated sideband signal.

A simpler way, especially in the analogue domain, is to produce the two-sideband signal 223 with a square-wave modulation signal 222, illustrated in FIG. 1d. This produces a sideband signal with the waveform illustrated in FIG. 1e, containing modulated signal components not only at the basic frequency of the square-wave, but also at all odd harmonic frequencies of the basic frequency, as figure if illustrates. However, these harmonic sidebands do not make any practical difference since they can easily be filtered by the secondary resonator 21 and by the filter 23.

Regardless of how the two-sideband signal is generated, the drive tracking signal 221 is modulated so that at least two sidebands are formed in the two-sideband signal 223, one on each side of the primary frequency $F_{prim}$, and no signal component is present at the primary frequency. The two-sideband signal 223 is summed to the amplified sense signal 232 in summing element 29. The force-feedback signal 233 thereby contains a periodic modulation, and a corresponding periodically modulated force is imparted by the force-feedback transducer to the Coriolis mass. This modulation will then also be present in the sense signal 212. In the circuit illustrated in FIG. 1a, the force-feedback signal 233 may be an analogue voltage signal which is imparted to the force-feedback system by outputting a corresponding force-feedback voltage to the force-feedback transducer. Additionally, the force-feedback transducer may require a bias voltage added to the force-feedback voltage in order to generate the required force.

The summing element 29 may be any generic force-summing element which generates a sum force based on the two inputs 223 and 232, for example by summing the corresponding voltage inputs and then transmitting the sum voltage signal 233 to one or more force-feedback transducers. The summing element 29 could alternatively transmit one voltage input 223 directly to a first force-feedback transducer (or first set of force-feedback transducers) and the other voltage input 232 directly to a second force-feedback transducer (or second set of force-feedback transducers), without summing the actual signals.

The filter in 23 may advantageously have a resonance peak that roughly coincides with the secondary resonant frequency, making the force-feedback narrow band and stable in the presence of higher order resonant modes. The resonance of 23 and the force-feedback circuit together change the secondary oscillation response of the Coriolis mass.

Figure 2:
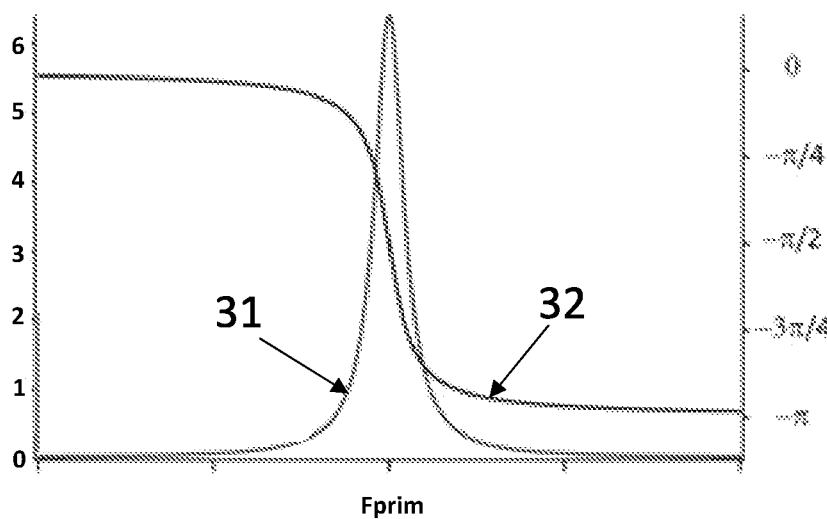
FIG. 2 illustrates the oscillation amplitude and phase of a typical mechanical resonator without force-feedback.
Figure 3:
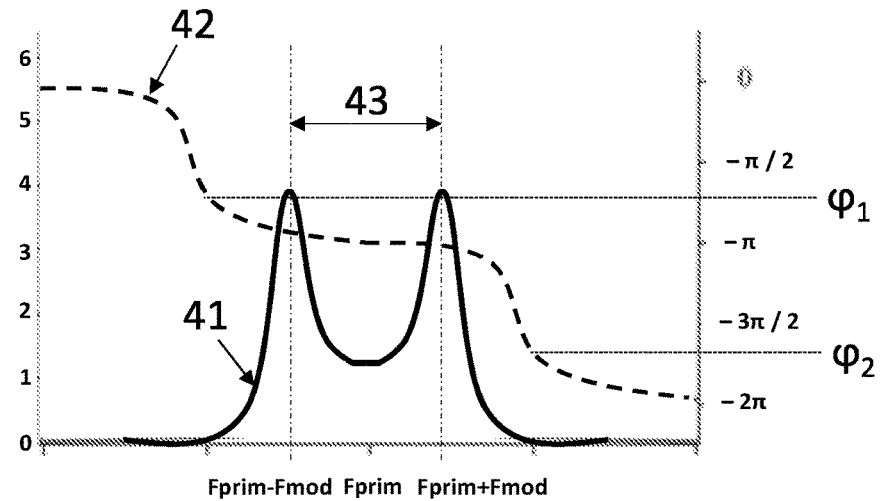
FIG. 3 illustrates the oscillation amplitude and phase of a typical mechanical resonator with force-feedback.

FIG. 2 illustrates the oscillation amplitude 31 and the oscillation phase 32 of a typical mechanical resonator around the resonance frequency without force-feedback. In contrast, FIG. 3 illustrates schematically a corresponding system where a filter 23 and a force-feedback circuit are used. FIG. 3 shows the frequency-dependence of the conditioned sense signal 231. The curve 41 illustrates the oscillation amplitude as a function of frequency and curve 42 shows the oscillation phase as a function of frequency. The phase at the center frequency must be $-\pi$ in order to have a stable feedback loop. The feedback creates a frequency band 43 around the primary oscillation frequency $F_{prim}$ where the oscillation phase of the Coriolis mass does not change rapidly as a function of frequency and the amplitude is nearly constant, unlike in FIG. 2.

The frequency response illustrated in FIG. 3 makes the gyroscope less sensitive to any discrepancies between the primary oscillation frequency $F_{prim}$ and the secondary resonant frequency $F_{sec}$ than would be the case without feedback. In the spectrum illustrated in FIG. 2, even a small shift of the secondary resonant frequency away from the value $F_{prim}$ could shift the phase of the mechanical output signal to such an extent that part of the signal induced by the Coriolis force could wrongly be detected as a quadrature signal and cancelled by a quadrature compensation mechanism. Similarly, a portion of the quadrature signal would be falsely interpreted as a component of the mechanical output signal, which would introduce an offset error to the sense signal. In contrast, a small change which shifts the secondary resonant frequency away from the value $F_{prim}$ in a mechanical resonator with the response illustrated in FIG. 3 does not to a significant extent link the true sense signal to quadrature errors or vice versa, because no great differences in oscillation phase is introduced by such a shift. However, when great accuracy is required, even this small shift can't be ignored. It is possible to cancel even the small errors caused by a phase shift in FIG. 3 by forcing the phase of the secondary frequency response to stay constant by locking it to the primary frequency.

However, if frequency matching would be implemented on a mechanical oscillator which has the oscillation spectrum shown in FIG. 2, the secondary mechanical resonance frequency may relatively easily shift so far from the primary oscillation frequency that the amplitude will decrease significantly, which could impair the signal-to-noise ratio of the sense signal. The force-feedback operation illustrated in FIG. 3 will greatly decrease the influence of the drift on the amplitude and phase of the sense signal, but the signal-to-noise ratio may still be affected because the undamped secondary resonance characteristic will determine the loop gain and thus the noise cancellation factor. In force-feedback operation, the secondary resonant frequency $F_{sec}$ should preferably differ from the primary oscillation frequency $F_{prim}$ by less than the required sense signal bandwidth.

A typical sense signal bandwidth for an automotive gyroscope is 100 Hz and a typical primary oscillation frequency is 20 kHz. The signal quality is not in practice impaired at all if the drift of the secondary resonant frequency can be kept below 20 Hz, i.e. 0.1% of the operating frequency. In a practical gyroscope the initial mismatch and drift of the frequencies could be up to 2% of the center frequency, resulting in a 400 Hz difference between the primary oscillation and secondary resonant frequencies. If such a frequency difference would occur, the signal-to-noise ratio would be degraded by a factor of four.

Gyroscope with Self-Test

Figure 4A:
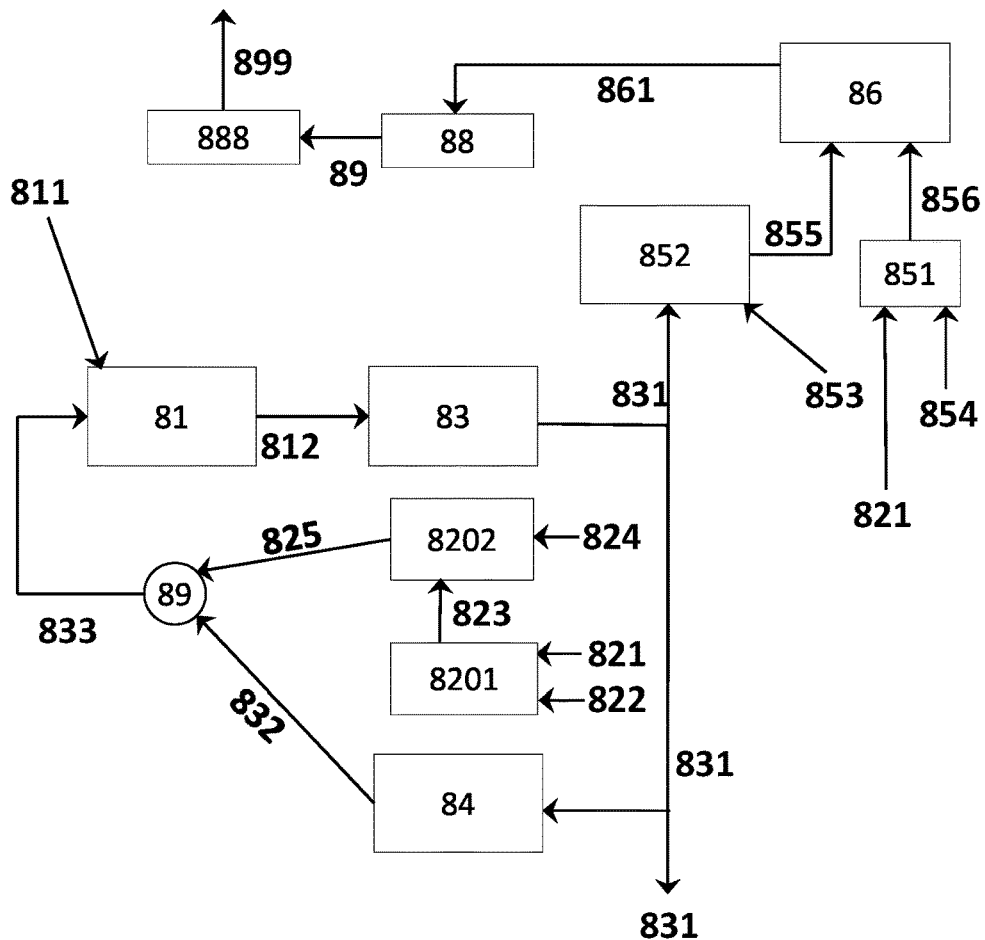
FIGS. 4a-4c illustrate gyroscopes with self-test circuits.

FIG. 4a illustrates a gyroscope with a modulation path where multiple modulators are connected in series. Reference numbers 81, 811-812, 821, 822, 823, 83 and 831-833 correspond to reference numbers 21, 211-212, 221, 222, 223, 23 and 231-233, respectively, in FIG. 1a.

The device illustrated in FIG. 4a comprises a first sideband modulator 8201 and a second sideband modulator 8202. The first sideband modulator 8201 receives as input the drive tracking signal 821 and a first modulation signal 822. The first sideband modulator 8201 thereby produces a once-modulated first sideband signal 823 in the same manner as the first sideband modulators produced the two-sideband signal 223 presented in the discussion above. The frequency of the first modulation signal 822 may be relatively low, for example between 100-1000 Hz.

The modulating frequency may for example be such that the sideband frequencies deviate no more than 10% from the primary oscillation frequency and fall within the band 43 of FIG. 3. This ensures that the phase shift of the signal at the sideband frequencies is representative of the phase shift at the primary oscillation frequency. If the modulating frequency is for example 10% of the primary oscillation frequency and the modulation signal is generated through division by ten from the drive tracking signal, then the demodulation signal can also be generated by division by ten but with some phase shift, or in other words, delay compared to the modulation signal to compensate for the group delay of the force-feedback loop.

It may also be advantageous to modulate the drive tracking signal in quadrature phase with respect to the Coriolis-force induced mechanical input signal. This way small asymmetries and inaccuracies that may leave some residual signal at the primary frequency will be in quadrature phase and not mixed with the Coriolis-force induced signal.

The second sideband modulator 8202 receives the once-modulated first sideband signal 823 as input and multiplies it with a second modulation signal 824 to produce a twice-modulated second sideband signal 825 which is then imparted to the force-feedback transducer.

The gyroscope comprises a self-test circuit which includes a first sideband demodulator 851 and a second sideband demodulator 852. In the gyroscope illustrated in FIG. 4a, the first sideband demodulator 851 is configured to receive the drive tracking signal 821 as input and to demodulate the drive tracking signal 821 at the first modulation frequency before it enters the multiplier 86. The second sideband demodulator 852 is configured to receive the sense signal 831 as input and to demodulate the sense signal 831 at the second modulation frequency before it enters the multiplier 86.

The first sideband demodulator 851 is in this case configured to receive the drive tracking signal 821 as input and to demodulate the drive tracking signal 821 at the first modulation frequency before it enters the multiplier 86 as a first multiplier input 856. The second sideband demodulator 852 is configured to receive the filtered sense signal 831 as input and to demodulate the filtered sense signal 831 at the second modulation frequency before it enters the multiplier 86 as a second multiplier input 855.

The first sideband demodulator 851 also receives as input a demodulation signal 854. The second sideband demodulator 852 receives as input a demodulation signal 853. If the group delay caused by the resonator feedback loop is small, the demodulation signal 853 may be the same as the second modulation signal 824 and demodulation signal 854 may be the same as the first modulation signal 822. If the group delay needs to be compensated for, then the demodulation signals may be phase-shifted or time-delayed from the corresponding modulation signal. This applies also in the embodiments presented below.

The once-demodulated second multiplier input 855 will not comprise the modulation produced by the second modulation signal 824 and the second sideband modulator 8202, but it will still comprise the modulation produced by the first modulation signal 822 and first sideband modulator 8201. On the other hand, the once-demodulated first multiplier input 856 will not comprise the modulation produced by the first modulation signal 822 and the first sideband modulator 8201, but it will still comprise the modulation produced by the second modulation signal 824 and second sideband modulator 8202.

The multiplier 86 thereby receives the first multiplier input 855, which is the once-demodulated sense signal, and multiplies it with the second multiplier input 856, which is the once-demodulated drive tracking signal.

The first sideband demodulator 851 may alternatively be configured to receive the sense signal 831 as input and to demodulate the sense signal at the first modulation frequency before it enters the multiplier 86, and the second sideband demodulator 852 may then be configured to receive the drive tracking signal 821 as input and to demodulate the drive tracking signal 821 at the second modulation frequency before it enters the multiplier 86. This option has not been separately illustrated. The demodulation signals 854 and 853 would in this case still enter the first and second demodulators 851 and 852, respectively, as in FIG. 4a.

Alternatively, the first sideband demodulator and second sideband demodulator may be connected in series and configured to receive the sense signal as input and to demodulate the sense signal at the first modulation frequency and second modulation frequency, respectively, before it enters the multiplier.

Alternatively, the first sideband demodulator and second sideband demodulator may be connected in series and configured to receive the drive tracking signal as input and to demodulate the drive tracking signal at the first modulation frequency and second modulation frequency, respectively, before it enters the multiplier.

Figure 4B:
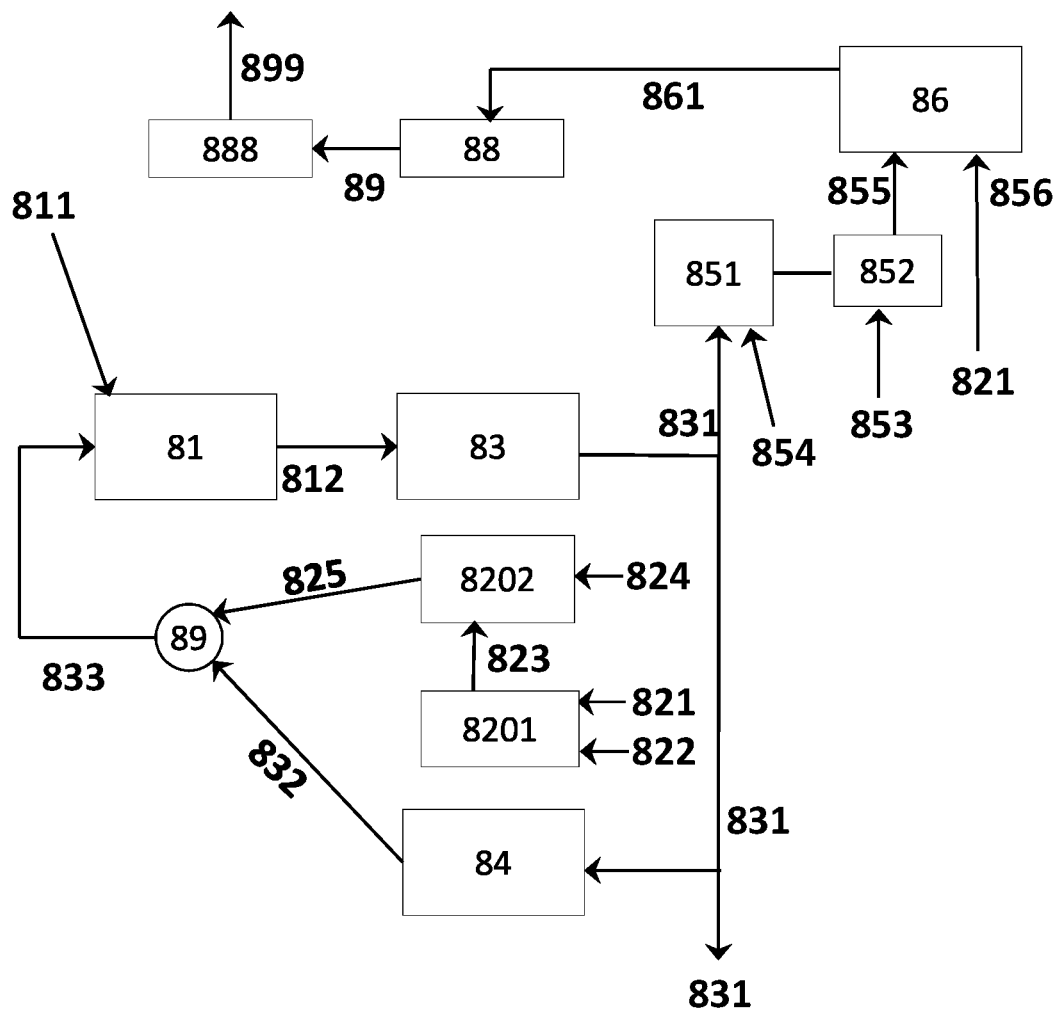

FIG. 4b illustrates a gyroscope where the sense signal is demodulated twice but the reference signal is not demodulated. The first sideband demodulator 851 and second sideband demodulator 852 are here connected in series and configured to receive the sense signal 831 as input and to demodulate the sense signal 831 at the first modulation frequency and second modulation frequency, respectively, before it enters the multiplier 86. In other words, the first demodulator 851 receives the sense signal 831 as input and demodulates it at the first modulation frequency provided by demodulation signal 854. The first demodulator 851 then outputs the once-demodulated filtered sense signal to the second demodulator 852, which demodulates it at the second modulation frequency provided by demodulation signal 853. The twice-demodulated filtered sense signal is then sent to the multiplier 86 as first multiplier input 855. The drive tracking signal 821 enters the multiplier 86 directly as second multiplier input 856 without demodulation.

Figure 4C:
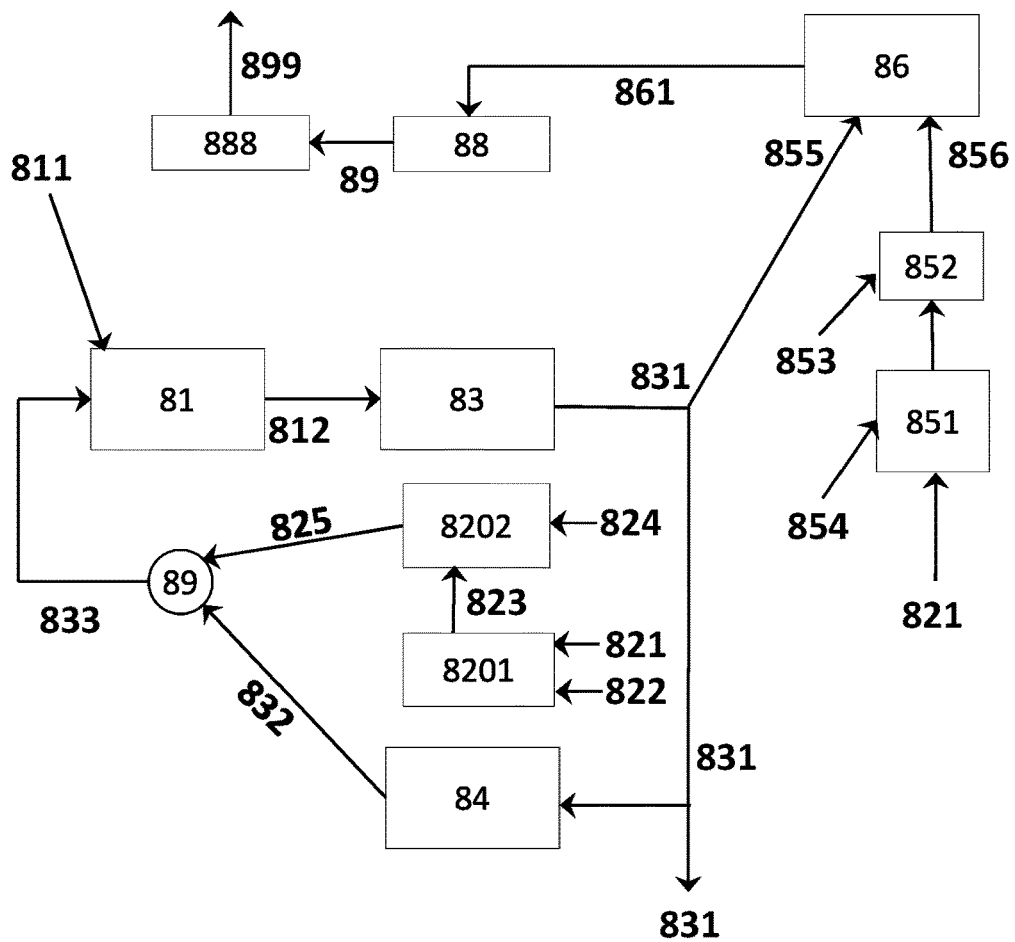

Finally, FIG. 4c illustrates a gyroscope where the drive tracking signal is demodulated twice but the sense signal is not demodulated. The first sideband demodulator 851 and second sideband demodulator 852 are connected in series and configured to receive the drive tracking signal as input and to demodulate the drive tracking signal at the first modulation frequency and second modulation frequency, respectively, before it enters the multiplier 86. In other words, the first demodulator 851 receives the drive tracking signal 821 as input and demodulates it at the first modulation frequency provided by demodulation signal 854. The first demodulator then outputs the once-demodulated drive tracking signal to the second demodulator 852, which demodulates it at the second modulation frequency provided by demodulation signal 853. The twice-demodulated drive tracking signal is then transmitted to the multiplier 86 as second multiplier input 856. The sense signal 831 enters the multiplier 86 directly as first multiplier input 855 without demodulation.

When the first and second sideband demodulators are connected in series, their ordering may differ from the order shown in FIGS. 4b and 4c. In other words, the signal which will be demodulated may enter the second demodulator 852 first, from there be transmitted to the first demodulator 851 and then onward to the multiplier.

In each of FIGS. 4a, 4b and 4c, the multiplier 86 in the self-test circuit is configured to receive the sense signal and drive tracking signals (at least one of which has been demodulated) as inputs 855 and 856, multiply them with each other and output a self-test signal 861. The self-test signal 861 is passed through a low-pass filter 88 to produce a low-pass filtered self-test signal 89. The low-pass filtered self-test signal may be transmitted to a control unit 888.

The control unit 888 is configured to compare the amplitude of the low-pass filtered self-test signal 89 to a predetermined lower threshold value and to a predetermined upper threshold value and to generate a self-test failure indicator 899 if the low-pass filtered self-test signal 861 is below the lower threshold value or above the upper threshold value. The amplitude of the self-test signal depends on the amplitude and phase characteristics of the secondary resonator in the feed-back loop. Failures in the secondary system may increase or decrease the amplitude or change the phase of the pilot tones. All these will be detected by the synchronous detection performed by the multiplier since the self-test signal is proportional to the average amplitude of the pilot tones and to the cosine of the phase shift at the primary frequency.

Figure 4D:
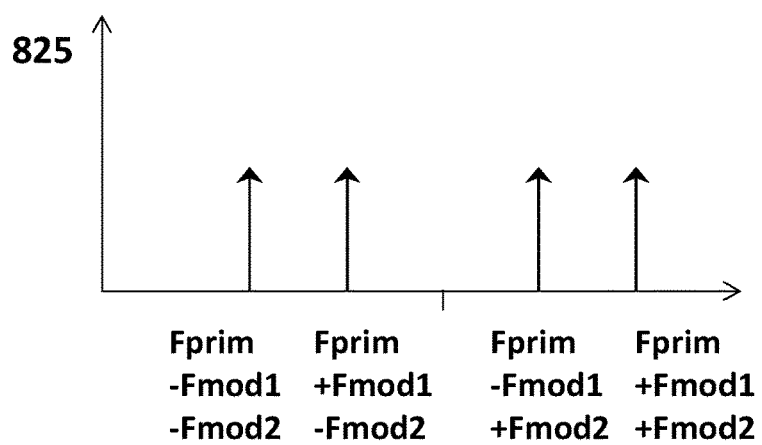
FIGS. 4d-4j illustrate self-test simulations.
Figure 4E:
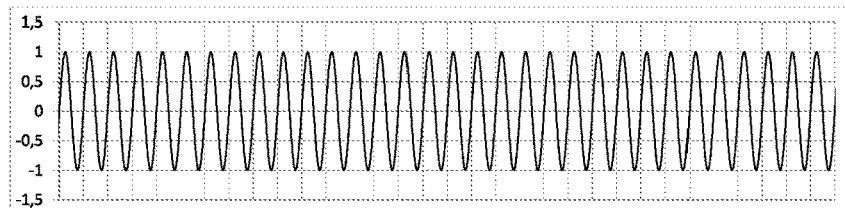
Figure 4E:
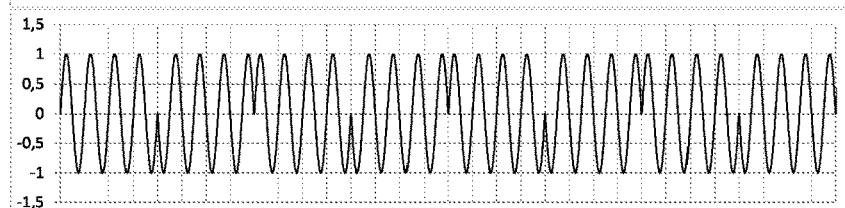
Figure 4E:
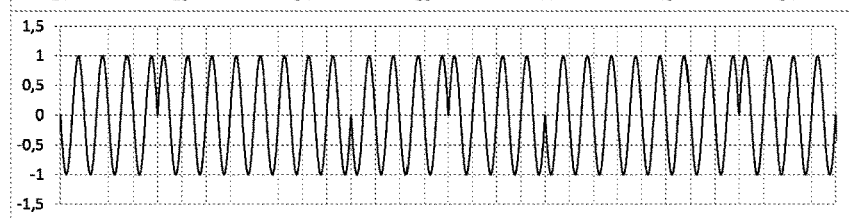
Figure 4E:
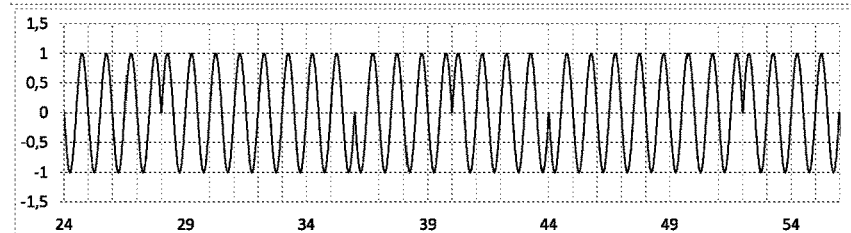
Figure 4E:
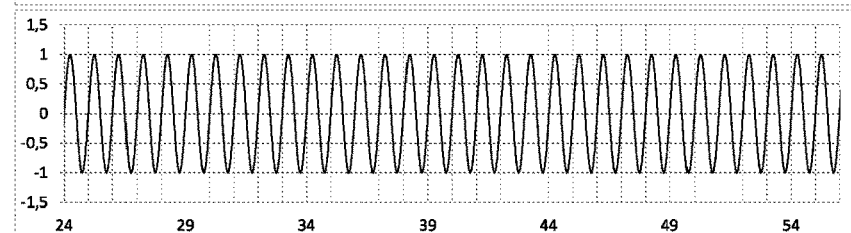
Figure 4E:
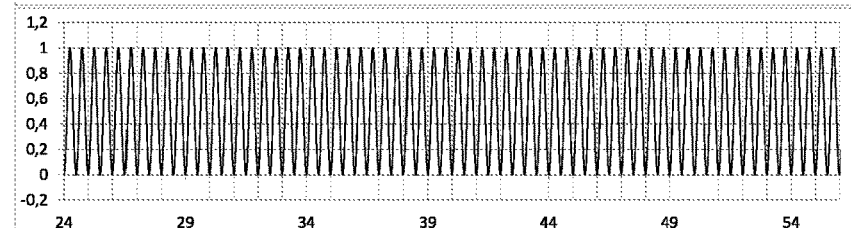
Figure 4E:
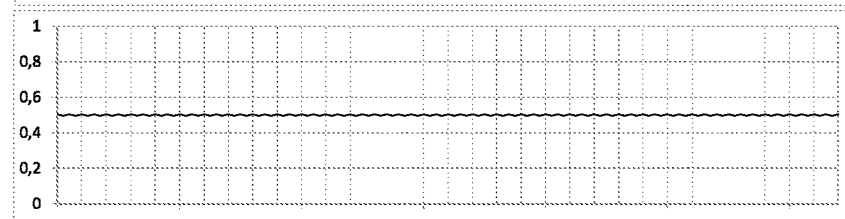
Figure 4F:
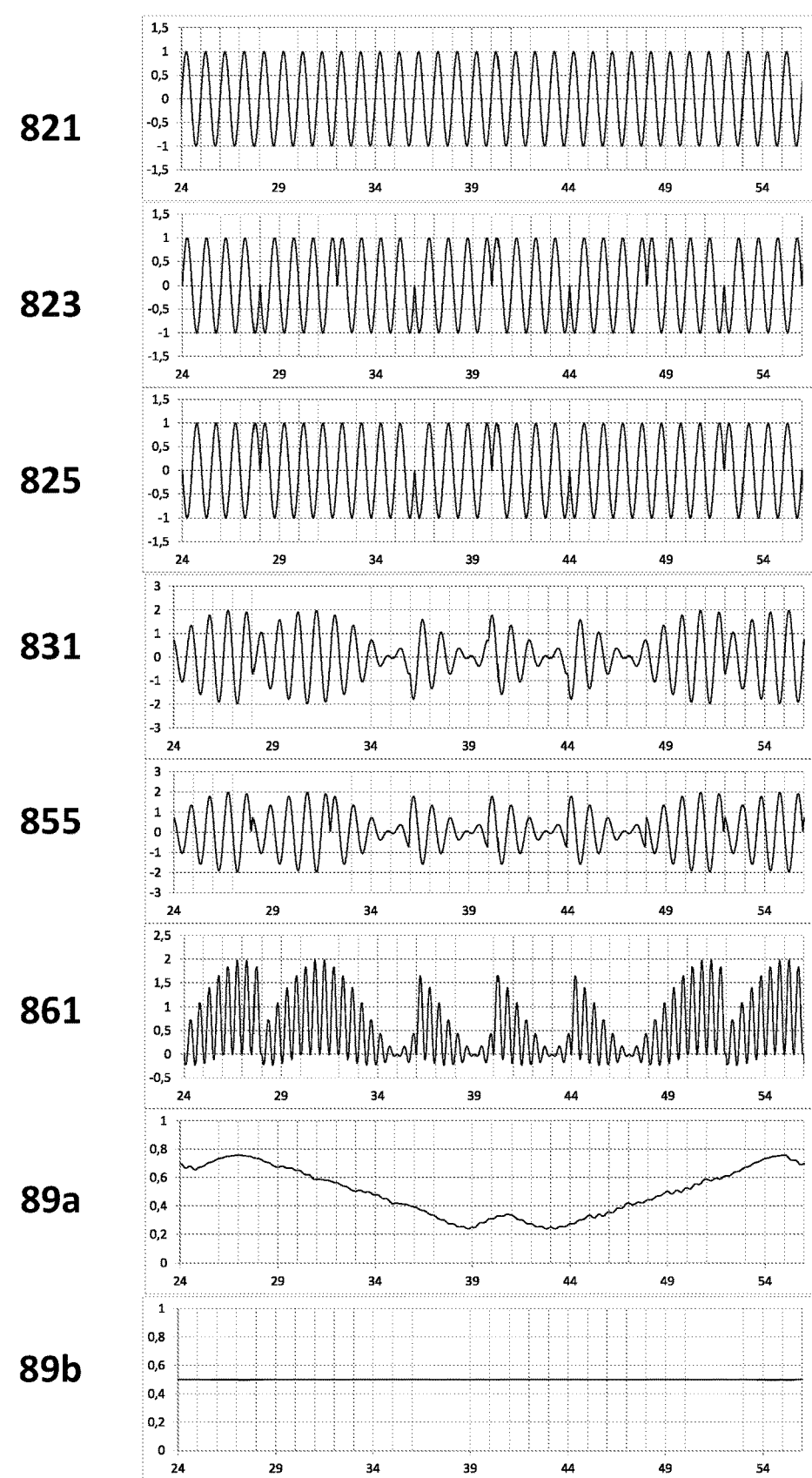

FIGS. 4d-4f illustrate a simulation of the self-test described above and FIGS. 4g-4j illustrate a comparison simulation without double modulation. The technical significance of double modulation can be illustrated by comparing the signals generated for example in the device illustrated in FIG. 4b to those generated in the device illustrated in FIG. 4g.

FIG. 4d illustrates the spectrum of the twice-modulated second side-band signal 825 of the device of FIG. 4a, 4b or 4c. The spectrum has four pilot tones at frequencies $F_{prim} - F_{mod1} - F_{mod2}$, $F_{prim} + F_{mod1} - F_{mod2}$, $F_{prim} - F_{mod1} + F_{mod2}$ and $F_{prim} + F_{mod1} + F_{mod2}$.

FIG. 4e illustrates simulated waveforms for signals 821, 823, 825, 831, 855, 861 and 89 in an example where the system of FIG. 4b is operating without external disturbances. Square-wave modulation is used to generate the force feed-back signal 825. In these examples, the first modulation frequency $F_{mod1}$ was chosen to be 1/32 of the primary oscillation frequency $F_{prim}$, and the second modulation frequency $F_{mod2}$ was chosen to be 1/8 of the primary oscillation frequency $F_{prim}$. This selection of frequencies produces sidebands where no signal component lies close to the frequency of the drive tracking signal even if square wave modulation is used. For simplicity, the frequency characteristics of the force feed-back loop are assumed to be very wide band compared to the side bands with pilot tones. The low-pass filtered self-test signal 89 obtains a nominal value 0.5. Depending on normal thermal and aging effects the upper and lower threshold level could be selected to be e.g. 0.55 and 0.45. If the self-test signal is between these levels the self-test is deemed passed and if it is outside the levels it is deemed failed.

FIG. 4f illustrates simulated waveforms for signals 821, 823, 825, 831, 855, 861 and 89 in an example where the system of FIG. 4b is operating with an external disturbance due to e.g. mechanical vibration added to the mechanical input signal 811. This external vibration signal has a frequency and amplitude which are equal to those of the upper-most sideband of the signal 825. The low-pass filtered self-test signal 89a has a value that fluctuates at $F_{mod2}$ and $F_{mod1}$. By changing the low-pass filter characteristics this fluctuation may be filtered out and a DC signal 89b can be produced. Digital filtering by producing a floating average over time interval equal to one period of the second modulation frequency is a simple and efficient method for achieving the desired low-pass filter characteristics since it will produce a zero at the frequencies of fluctuation. A value 0.5 is produced for the self-test signal 89b, the same as in the simulation without the external disturbance in FIG. 4e and the self-test is therefore deemed passed. Using four pilot tones produced by double modulation and again using double demodulation, multiplication and low-pass filtering is thus a robust self-test method that works under the influence of external disturbances.

Figure 4G:
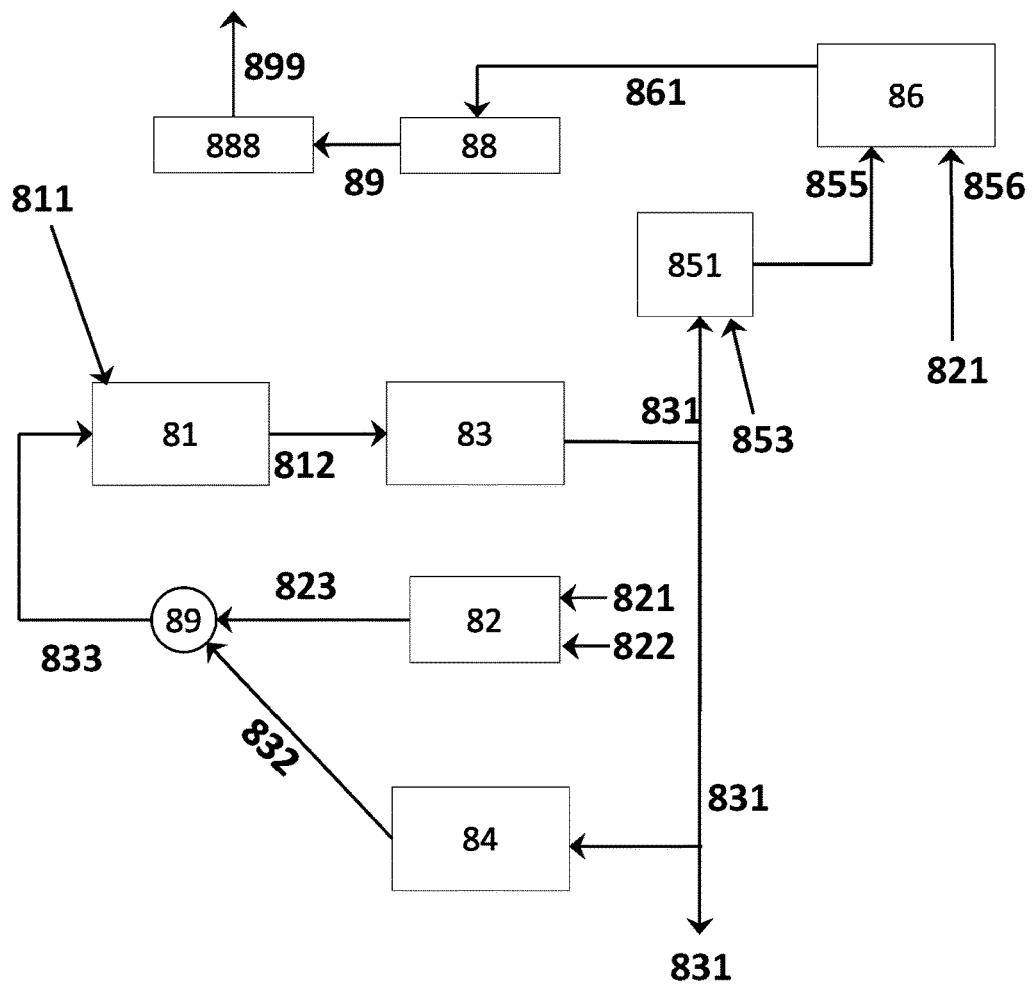
Figure 4H:
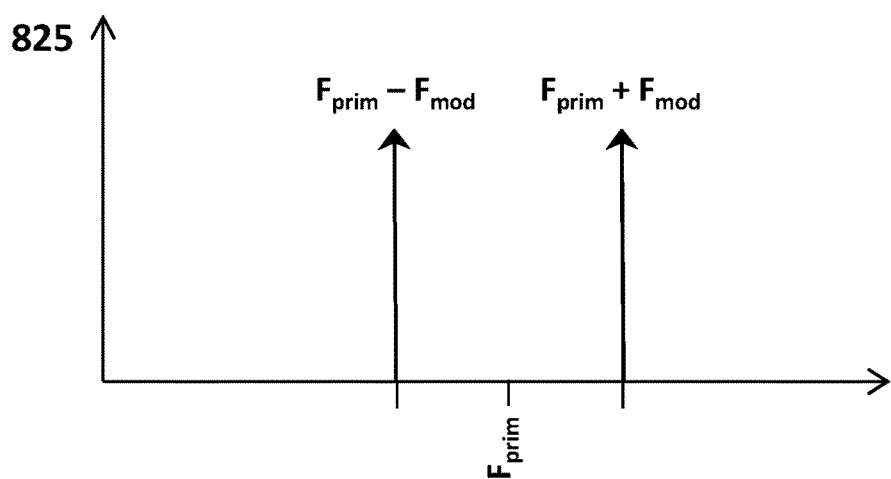

It is impossible to compare this result of the double modulation/demodulation with all possible methods for generating and evaluating the pilot tones, but to illustrate the significance of double modulation it may be compared with the case with a circuit according to the FIG. 4g, where reference numbers 81-84, 89, 811, 812, 821-823 and 831-833 correspond to reference numbers 21-24, 29, 211, 212, 221-222, 223 and 231-233, respectively, in FIG. 1a. The self-test circuit in FIG. 4g comprises the same elements 851, 853, 855, 856, 86, 861, 88, 89, 888 and 899 which were introduced in FIG. 4a. However, in this circuit only two pilot tones are generated with a single modulation as illustrated by the spectrum of signal 825 in FIG. 4h. Only a single demodulation (in demodulator 851) is therefore needed for evaluating the pilot tones in the self-test circuit.

Figure 4I:
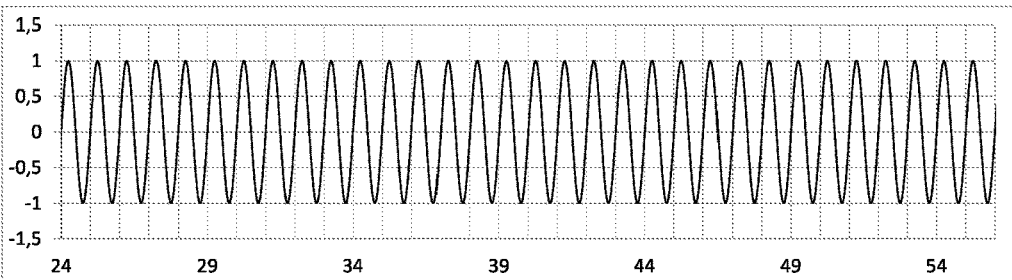
Figure 4I:
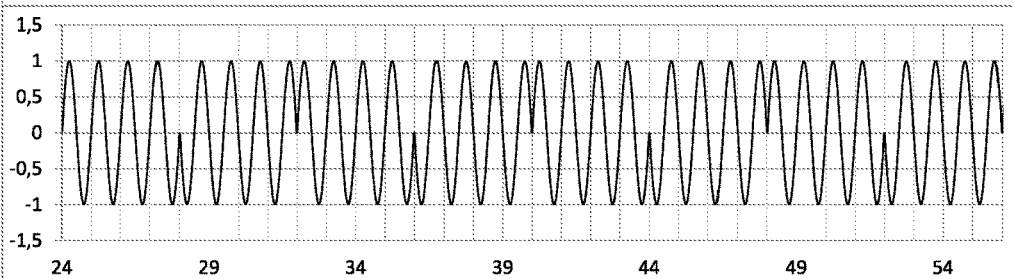
Figure 4I:
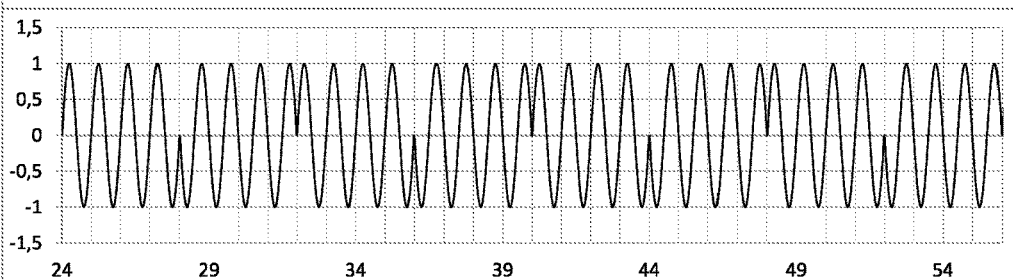
Figure 4I:
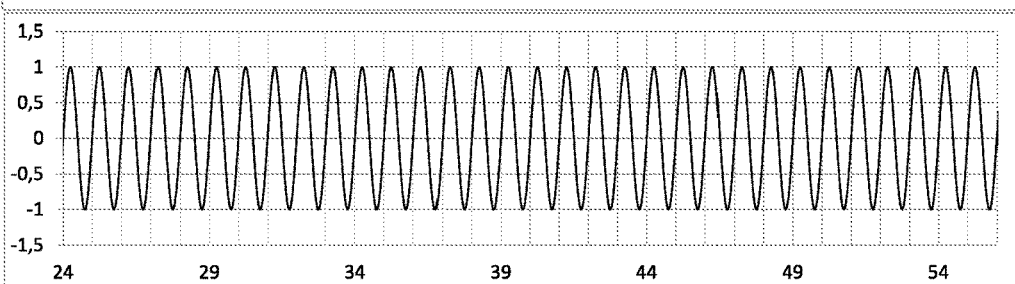
Figure 4I:
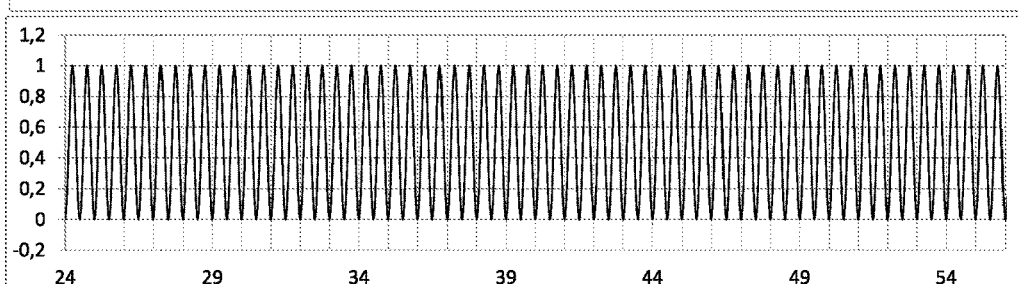
Figure 4I:
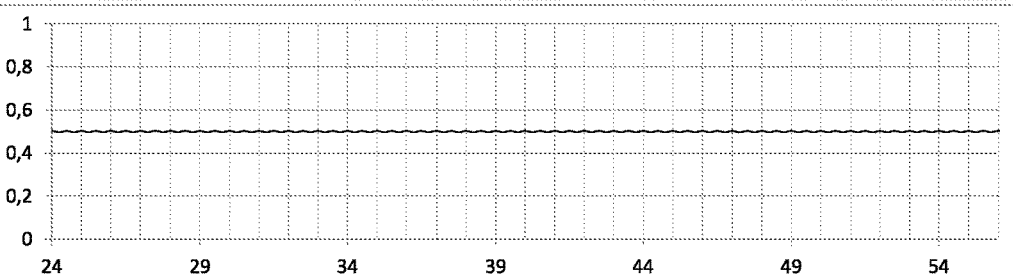

FIG. 4i illustrates simulated waveforms for signals 821, 825, 831, 855, 861 and 89 in an example where the system of FIG. 4g is operating without external disturbances. The self-test signal 89 obtains a nominal value 0.5 and self-test is thus deemed passed.

Figure 4J:
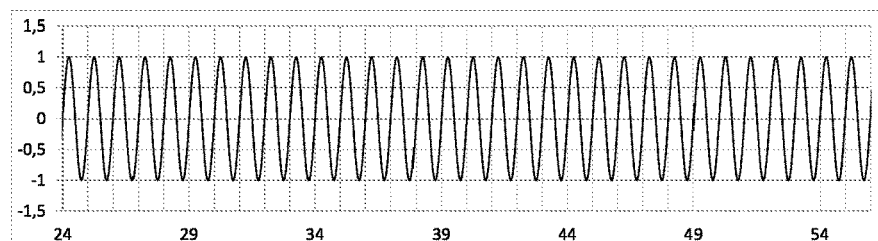
Figure 4J:
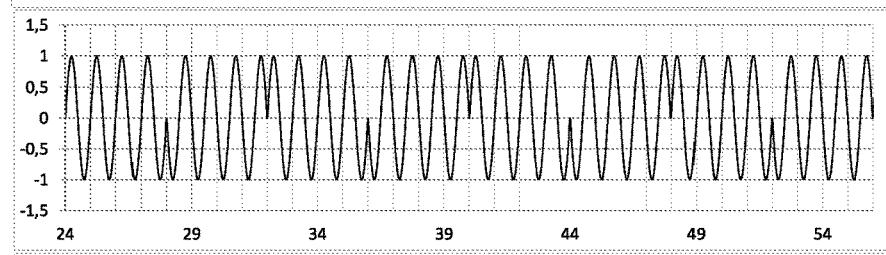
Figure 4J:
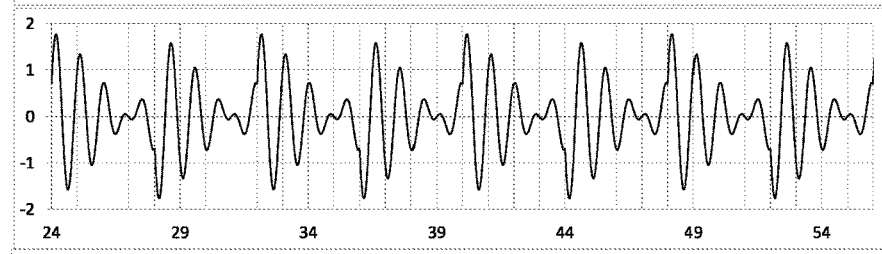
Figure 4J:
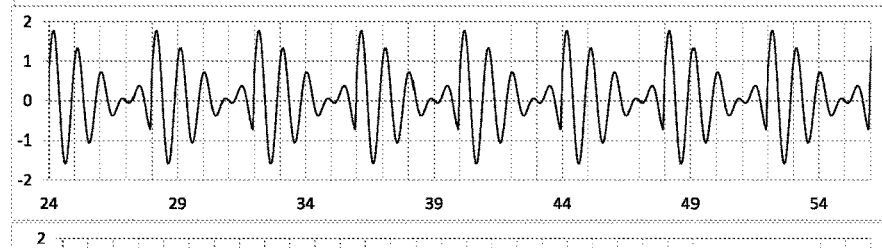
Figure 4J:
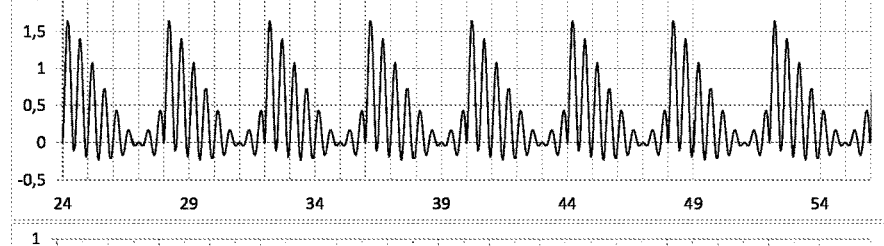
Figure 4J:
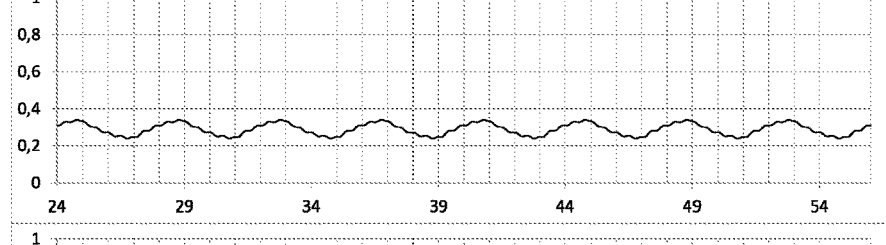
Figure 4J:
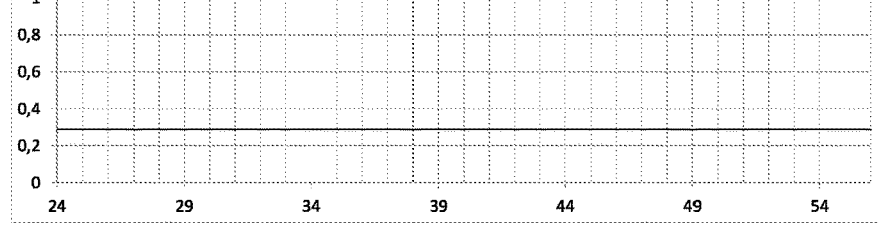

FIG. 4j illustrates simulated waveforms for signals 821, 825, 831, 855, 861 and 89 in an example where the system of FIG. 4g is operating with an external disturbance due to e.g. mechanical vibration added to the mechanical input signal 811. This external vibration signal has a frequency and amplitude which are equal to those of the upper sideband of the signal 825. The low-pass filtered self-test signal 89a has a value that fluctuates at $F_{mod1}$. By changing the low-pass filter characteristics this fluctuation may be filtered out and a DC signal 89b can be produced. A value of about 0.3 is produced for the self-test signal 89b. This is lower than the lower threshold level defined above and the self-test is thus deemed failed. But this should not happen since the system is still operating according to the design intent without any failures. In other words, the self-test with two pilot tones generated by a single modulation and evaluated by single demodulation may generate a false alarm if an external disturbance is affecting the system.

Frequency Feedback

The operation of the gyroscopes illustrated in in FIGS. 4a-4c may be improved by including a frequency-feedback circuit which locks the secondary resonant frequency to the primary oscillation frequency. This is illustrated in FIG. 5.

The frequency-feedback circuit is coupled to a multiplier 86a. In FIG. 5 the first input 855 to the multiplier 86a is the same twice-demodulated input which is fed to the multiplier 86 in the self-test circuit. The second input 821-quad is the drive tracking signal 821 which has been phase-shifted to quadrature phase. The multiplier 86a produces a phase comparison signal 862 which has an amplitude proportional to the phase difference between the sense signal and the drive tracking signal. The frequency-feedback circuit comprises a controller 87 which receives the phase comparison signal 862. If the DC-component of the phase comparison signal has a nonzero value, the controller uses it to adjust the secondary resonant frequency $F_{sec}$ of the Coriolis mass. The phase comparison signal 862 can either be fed directly to the controller 27, as illustrated, or it can be passed through an optional low-pass filter to produce a filtered phase comparison signal which is then fed to the controller 27.

Figure 5:
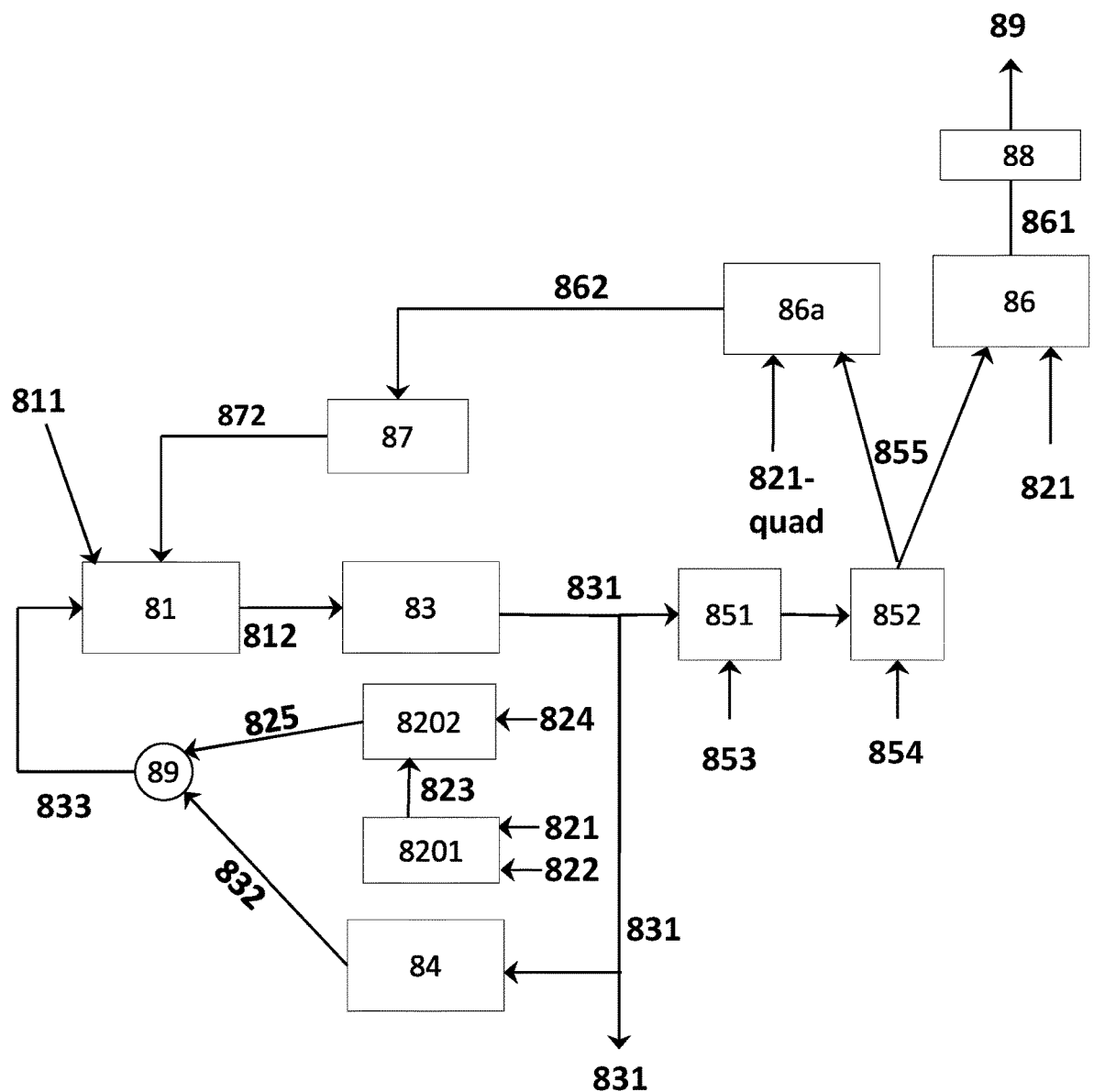
FIG. 5 illustrates gyroscopes with a frequency-feedback circuit and a self-test circuit.

In FIG. 5, the frequency adjustment is made by applying a frequency-adjusting (voltage) signal 872 to frequency-control transducers (not illustrated) coupled to the Coriolis mass.

It is well known that due to a non-linear voltage-displacement dependence in some electrostatic transducers an effective negative spring constant component is generated that can be controlled by the voltage applied to the transducer. This phenomenon is also called electrostatic spring softening. By controlling the negative spring constant component, the resonant frequency can be shifted downwards by the applied voltage.

The controller may form a frequency-control voltage based on the phase comparison signal. The controller then outputs the frequency-control voltage to a frequency-control transducer which is coupled to the Coriolis mass. The controller imposes an effective negative spring force on the Coriolis mass and keeps the sense signal phase shift at $-\pi$ at the primary resonant frequency $F_{prim}$ by keeping the secondary resonant frequency $F_{sec}$ equal to the primary oscillation frequency $F_{prim}$.

The frequency-control transducers may for example be same transducers as the sense transducers mentioned above, or separate frequency-feedback transducers dedicated only for frequency control. The force-feedback transducers are less suited for frequency control since the output signal amplitude would then be affected by the frequency control voltage. It is well known that constant force can be generated by a electrostatic transducer by applying either a DC-voltage or an AC voltage at sufficiently high frequency so that the Coriolis mass is virtually motionless at this frequency. By using DC-voltage for detection or feedback and AC-voltage for frequency control or vice versa (AC-voltage for detection or feedback and DC-voltage for frequency control), a complete separation of these functions may be achieved in the same transducer. In principle it would be possible to also control the primary oscillation frequency, but it is very difficult to design frequency control transducers that would be compatible with the high amplitude of the primary motion.

In other words, the phase of the sense signal is compared to the phase of the drive tracking signal 821, which contains the phase of the primary oscillation of the Coriolis mass. If the phase difference is $-\pi$, then $F_{sec}$ is necessarily equal to $F_{prim}$ because the phase shift of the feedback loop at the secondary resonant frequency equals to $-\pi$. If there is a phase difference, then the magnitude of that phase difference is proportional to the frequency difference between $F_{sec}$ and $F_{prim}$ according to the frequency response curve 4 and the secondary resonant frequency $F_{sec}$ can be forced toward the value $F_{prim}$ by the frequency-feedback circuit.

The controller can alternatively be configured to form a frequency-control signal based on the phase comparison signal and to output the frequency-control signal to the filter 83 in the readout circuit. The controller keeps the sense signal phase shift equal to $-\pi$ at the primary oscillation frequency $F_{prim}$ by frequency-locking the filter to the primary frequency. In this case, the controller helps in avoiding phase-shift related issues that may mix the in-phase signal and the quadrature signal, but it doesn't help in maintaining the signal-to noise ratio at an optimal value.

If the readout circuit also comprises a phase shifter which receives the sense signal from the filter 83, then the controller 67 may be configured to form a frequency-control signal based on the phase comparison signal and to output the frequency-adjusting signal to the phase shifter. This changes the phase of the sense signal until it matches the phase difference at the multiplier. The controller thereby keeps the sense signal phase shift at $-\pi$ at the primary resonant frequency $F_{prim}$. Also in this case, the controller helps in avoiding phase-shift related issues that may mix the in-phase and quadrature signals, but it doesn't help in maintaining the signal-to noise ratio at optimal value.

Practical Modulators and Demodulators

An ideal modulator is a multiplier circuit that multiplies two sinusoidal signals. It is, however, quite difficult to design and manufacture at low cost low power analogue multipliers. Instead, simpler circuits may be used that can produce modulated signals that closely resemble those of an analog multiplication of sinusoidal signals. By way of example, the reference numbers of FIG. 1a will be used to refer to the signals.

Figure 6A:
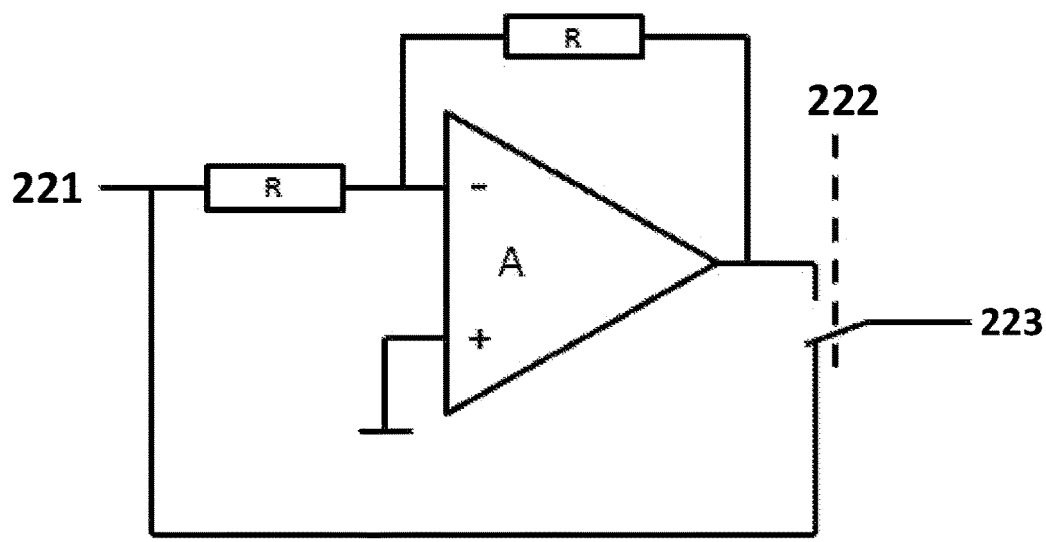
FIGS. 6a-6e illustrate practical modulators and demodulators.

FIG. 6a illustrates a circuit that can easily produce a square wave modulation. The same circuit can be used also as a de-modulator. The drive tracking signal 221 is inverted with an inverting amplifier, and at the modulating frequency $F_{mod}$ (the frequency of modulation signal 222) the output is altered between the non-inverted and the inverted signal.

Figure 6B:
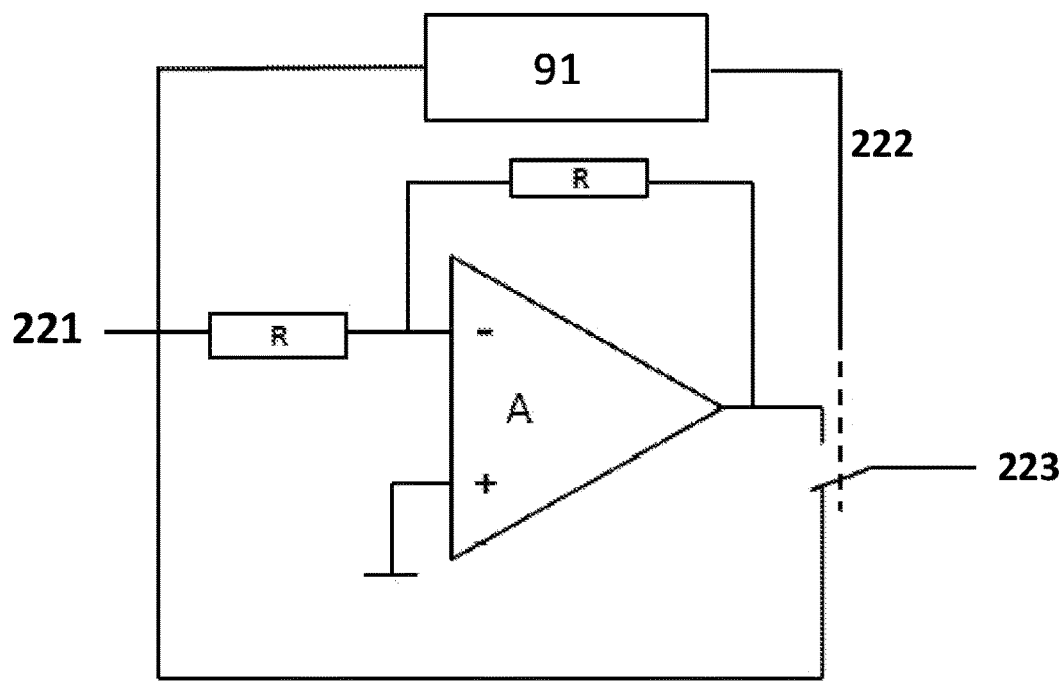

It is convenient if the modulating frequency $F_{mod}$ is derived from the primary frequency $F_{prim}$ by division by an integer or half integer. Then it is only needed to count the periods (or half periods) and change the modulating switch position when a pre-determined number of counts have been reached. FIG. 6b illustrates a circuit where a frequency divider generates the modulation signal 222 from the drive tracking signal 221.

Figure 6C:
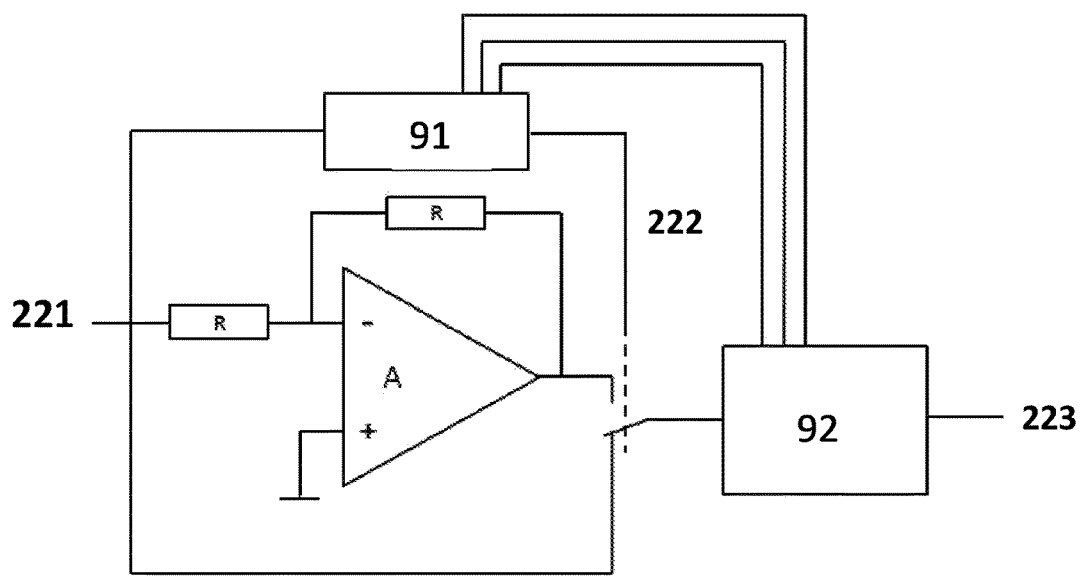

Harmonic sidebands produced by the simple modulator/de-modulator of FIG. 6b can be easily avoided by providing an additional variable gain stage 92 also controlled by the frequency divider 91, as shown in FIG. 6c. The gain 92 will be modulated at discrete steps that may change every half-period of the drive tracking signal 221.

Figure 6D:
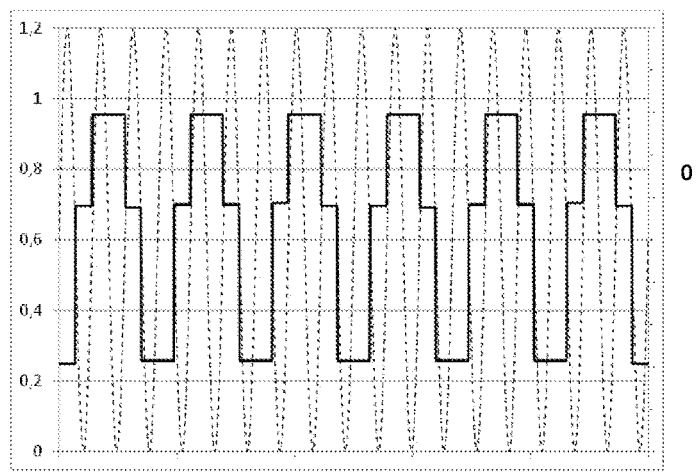
Figure 6E:
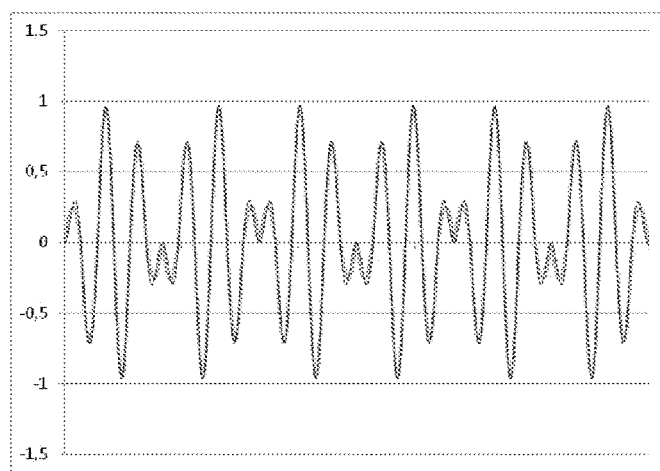

An example of such a signal is given in FIG. 6d, where the gain value of the gain stage 92 as a function of time is indicated by the solid line. Gain values are shown on the left vertical axis. The dashed line is the drive tracking signal 221, and its zero point is indicated on the right axis. The gain value may be programmed to change at the zero crossings of the drive tracking signal 221. For simplicity only three gain values are needed in this example, since the modulating signal frequency $F_{mod}$ is one third of the primary oscillation frequency. The lower the modulating frequency, the more gain values are required for accurate reproduction of sinusoidal modulation. FIG. 6e shows as the solid gray line the modulated waveform of the modulator of FIG. 6c, with the gain values of FIG. 6d. As a reference, the waveform of a signal modulated by a sinusoidal signal is shown with a dashed line. The difference between these waveforms is so small that it has no practical consequences.

Demodulation may also be performed with a similar controlled gain stage. The gain values should then be inverse numbers of those shown in FIG. 6d. However, in demodulation the effect from square-wave demodulating signal may be negligible for the operation of the system since the low-pass filter present will filter out all generated harmonic frequencies.

It is also possible to perform the modulation in the digital domain, as FIG. 7a illustrates. In this case the drive tracking signal 721 has to be AD-converted before modulation. The modulated signal 723 could be converted back to the analogue domain and then added to the feed-back signal (this option is not illustrated), but it may often be more advantageous to use the digital summing node 78 of FIG. 7a if the low pass filter 73 is also implemented in digital domain. No DA-conversion of the modulated signal 723 is then needed.

Filtering the Modulation from the Output Signal

The modulated signal may be completely removed from the final gyroscope output after synchronous detection with an in-phase primary frequency signal by sampling the final output signal at the modulation frequency. This will cause a set of zeros to the sinc-function type frequency response at the modulating frequency and its harmonics. According to the Nyquist theorem the largest usable bandwidth will then be half of the modulating frequency.

The invention claimed is:

1. A microelectromechanical gyroscope which comprises
one or more Coriolis masses which are coupled to a drive transducer which actuates the one or more Coriolis masses into primary oscillation movement at a primary oscillation frequency $F_{prim}$, wherein the one or more Coriolis masses are configured to be actuated into secondary oscillation movement by the Coriolis force when the gyroscope undergoes angular rotation, and the secondary oscillation mode has a secondary resonant frequency $F_{sec}$,
a drive sensing circuit comprising a drive sensing transducer which is coupled to measure the primary oscillation movement of the one or more Coriolis masses and configured to generate a drive tracking signal which tracks the primary oscillation movement of the one or more Coriolis masses,
a readout circuit comprising a sense transducer which is coupled to measure the secondary oscillation movement of the one or more Coriolis masses and configured to generate a sense signal which tracks the secondary oscillation movement of the one or more Coriolis masses, a force-feedback system comprising a force-feedback transducer coupled to the one or more Coriolis masses and a force feedback circuit coupled to the force-feedback transducer, wherein the force-feedback circuit comprises a first sideband modulator which is configured to receive the drive tracking signal as input, to modulate the drive tracking signal with a first modulation frequency and to output a first sideband signal, wherein the force-feedback circuit further comprises a second sideband modulator which is configured to receive the first sideband signal as input, to modulate the first sideband signal with a second modulation frequency and to output a second sideband signal, and the force-feedback circuit further comprises a summing element which is configured to receive the sense signal and the second sideband signal as input, to sum them together to generate a force-feedback signal and to output the force-feedback signal to the force-feedback transducer, and wherein the gyroscope further comprises a self-test circuit coupled to the readout circuit, and the self-test circuit comprises a multiplier which is configured to receive the sense signal and the drive tracking signal as input, multiply them with each other and output a self-test signal to a low-pass filter, and the low-pass filter is configured to output a low-pass filtered self-test signal to a control unit, and wherein the self-test circuit further comprises a first sideband demodulator and a second sideband demodulator, and either the sense signal or the drive tracking signal is demodulated in the first sideband demodulator at the first modulation frequency before entering the multiplier, and either the sense signal or the drive tracking signal is demodulated in the second sideband demodulator at the second modulation frequency before entering the multiplier, and the control unit is configured to compare the amplitude of the low-pass filtered self-test signal to a predetermined lower threshold value and to a predetermined upper threshold value and to generate a self-test failure indicator if the low-pass filtered self-test signal is below the lower threshold value or above the upper threshold value.

2. The microelectromechanical gyroscope according to claim 1, wherein the first sideband demodulator is configured to receive the sense signal as input and to demodulate the sense signal at the first modulation frequency before it enters the multiplier, and the second sideband demodulator is configured to receive the drive tracking signal as input and to demodulate the drive tracking signal at the second modulation frequency before it enters the multiplier.

3. The microelectromechanical gyroscope according to claim 1, wherein the first sideband demodulator is configured to receive the drive tracking signal as input and to demodulate the drive tracking signal at the first modulation frequency before it enters the multiplier, and the second sideband demodulator is configured to receive the sense signal as input and to demodulate the sense signal at the second modulation frequency before it enters the multiplier.

4. The microelectromechanical gyroscope according to claim 1, wherein the first sideband demodulator and second sideband demodulator are connected in series and configured to receive the sense signal as input and to demodulate the sense signal at the first modulation frequency and second modulation frequency, respectively, before it enters the multiplier.

5. The microelectromechanical gyroscope according to claim 1, wherein the first sideband demodulator and second sideband demodulator are connected in series and configured to receive the drive tracking signal as input and to demodulate the drive tracking signal at the first modulation frequency and second modulation frequency, respectively, before it enters the multiplier.

* * * * *